(12) United States Patent
Louis

(10) Patent No.: US 7,362,170 B2
(45) Date of Patent: Apr. 22, 2008

(54) HIGH GAIN, HIGH EFFICIENCY POWER AMPLIFIER

(75) Inventor: Edward V. Louis, St. Charles, IL (US)

(73) Assignee: Andrew Corporation, Westbrook, IL (US)

( * ) Notice: Subject to any disclaimer, the term of this patent is extended or adjusted under 35 U.S.C. 154(b) by 159 days.

(21) Appl. No.: 11/291,172

(22) Filed: Dec. 1, 2005

(65) Prior Publication Data
US 2007/0126502 A1 Jun. 7, 2007

(51) Int. Cl.
*H03F 3/68* (2006.01)
(52) U.S. Cl. .................. 330/124 R; 330/286; 330/310; 330/53
(58) Field of Classification Search ............ 330/124 R, 330/53, 286, 310
See application file for complete search history.

(56) References Cited

U.S. PATENT DOCUMENTS

| | | | |
|---|---|---|---|
| 2,210,028 A | 8/1940 | Doherty |
| 2,255,476 A | 9/1941 | Thomas |
| 2,775,657 A | 12/1956 | Zeist |
| 5,017,888 A | 5/1991 | Meinzer |
| 5,420,541 A | 5/1995 | Upton |
| 5,739,723 A | 4/1998 | Sigmon |
| 5,786,727 A | 7/1998 | Sigmon |
| 5,880,633 A | 3/1999 | Leizerovich |
| 5,966,059 A | 10/1999 | Sigmon |
| 6,085,074 A | 7/2000 | Cygan |
| 6,097,252 A | 8/2000 | Sigmon |
| 6,262,629 B1 | 7/2001 | Stengel |
| 6,320,464 B1 | 11/2001 | Suzuki |
| 6,329,877 B1 | 12/2001 | Bowen |
| 6,396,341 B1 | 5/2002 | Pehlke |
| 6,700,444 B2 | 3/2004 | Pengelly |
| 6,731,172 B2 | 5/2004 | Thompson |
| 6,737,922 B2 | 5/2004 | Pengelly |
| 6,791,417 B2 | 9/2004 | Pengelly |
| 6,798,295 B2 | 9/2004 | Pengelly et al. |

(Continued)

FOREIGN PATENT DOCUMENTS

EP   1267483 A2   12/2002

(Continued)

OTHER PUBLICATIONS

Jangheon Kim, et al.; "Optimum Operation of Asymmetrical-Cells-Based Linear Doherty Power Amplifiers-Uneven Power Drive and Power Matching"; Article; May 5, 2005; 8 pages (1802-1809); IEEE Transactions on Microwave Theory and Techniques; vol. 53; No. 5; Piscataway, NJ, US.

(Continued)

*Primary Examiner*—Patricia Nguyen
(74) *Attorney, Agent, or Firm*—Wood, Herron & Evans, LLP

(57) ABSTRACT

An amplifier has a main amplifier circuit with multiple amplification stages, including a driving stage and an auxiliary amplifier circuit with multiple amplification stages, including a driving stage. A splitter circuit splits an input signal to provide path asymmetry in splitting the input signal between the main amplifier path and auxiliary amplifier path. The driving stage of the auxiliary amplifier circuit has a power rating higher than the power rating of the driving stage of the main amplifier circuit to provide a gain asymmetry in the amplifier circuit paths.

19 Claims, 1 Drawing Sheet

U.S. PATENT DOCUMENTS

| | | |
|---|---|---|
| 6,853,244 B2 | 2/2005 | Robinson |
| 6,853,245 B2 | 2/2005 | Kim |
| 6,864,742 B2 | 3/2005 | Kobayashi |
| 6,917,246 B2 | 7/2005 | Thompson et al. |
| 6,922,102 B2 | 7/2005 | Myer et al. |
| 7,193,473 B2 * | 3/2007 | Pengelly et al. ............ 330/295 |
| 2001/0030581 A1 | 10/2001 | Dent |
| 2003/0076167 A1 | 4/2003 | Hellberg |
| 2003/0137346 A1 | 7/2003 | Hellberg |
| 2004/0113698 A1 | 6/2004 | Kim |
| 2004/0174212 A1 | 9/2004 | Kim |
| 2004/0174213 A1 | 9/2004 | Thompson |
| 2004/0189381 A1 | 9/2004 | Louis |
| 2005/0129140 A1 | 6/2005 | Robinson |

FOREIGN PATENT DOCUMENTS

| | | |
|---|---|---|
| EP | 1583228 A2 | 10/2005 |
| GB | 2229057 A | 9/1990 |
| GB | 2393866 A | 4/2004 |
| WO | WO0239577 A2 | 5/2002 |
| WO | WO2004023646 A1 | 3/2004 |
| WO | WO2004023646 A1 | 3/2004 |
| WO | WO2004064247 A1 | 7/2004 |
| WO | WO2004088837 A2 | 10/2004 |
| WO | WO2005031967 A1 | 4/2005 |

OTHER PUBLICATIONS

John R. Gajadharsing, et al.; "Analysis and Design of a 200W LDMOS Based Doherty Amplifier for 3G Base Stations"; Article; Jun. 6, 2004; 4 pages (529-532); Microwave Symposium Digest 2004 IEEE MTT-S International; Fort Worth, TX, US; Piscataway, NJ, US.

Cripps, Stephen C.; "Advanced Techniques in RF Power Amplifier Design", pp. 33-57, Artech House, 2002.

* cited by examiner

HIGH GAIN, HIGH EFFICIENCY POWER AMPLIFIER

FIELD OF INVENTION

This invention is directed generally to RF power amplifiers and more particularly to improving the overall efficiency of high power RF power amplifiers while maintaining desirable system linearity.

BACKGROUND OF THE INVENTION

In the design of RF power amplifiers, such as for RF communication applications, it is desirable to improve the efficiency of an amplifier or amplification system while maintaining a desirable system linearity. Linearity and efficiency are often competing design characteristics when configuring a suitable RF amplification system. While linearity is required to reduce interference between adjacent RF signals in a band, to maintain the amplified signals in the band and to reduce distortion, the most linear amplifiers are also usually the most inefficient.

There have been various different amplifier designs utilized to improve efficiency. One design is the Doherty-type or Doherty amplifier, which utilizes a main amplifier or carrier, and an auxiliary or peaking amplifier to handle higher input signal levels. That is, in a certain range of input signal level, generally only the main amplifier is operational and providing the desired signal gain. However, at a higher input signal level, the auxiliary amplifier also begins to operate and contributes to the overall gain of the Doherty amplifier.

Doherty amplifiers offer a method of improving RF/microwave amplifier efficiency over that achieved by traditional Class AB amplifiers. The benefit is achieved when the Doherty amplifier operates at a power level that is backed off from the maximum power achievable at the amplifier output. Some examples of Doherty amplifier designs are set forth in U.S. Pat. No. 6,922,102, entitled "High Efficiency Amplifier" and U.S. patent application Ser. No. 10/795,055, entitled "High Efficiency Amplifier and Method of Designing Same," both patent and application being incorporated herein by reference in their entireties. Generally, in most applications, the power gain of such a Doherty amplifier is not sufficient to provide the entire gain required by the power amplifier. In such cases, the Doherty amplifier is preceded by at least one additional gain or amplification stage. Typically, the gain stage immediately preceding the Doherty stage is a Class AB device as illustrated in FIG. 1. This choice is generally a compromise between efficiency and linearity, considering the degradation in system efficiency that would occur if the driver stage were a Class A amplifier, and considering the degradation in system linearity that would occur if the driver stage were also a Doherty amplifier.

However, a driver stage that is also a Doherty amplifier offers better overall system efficiency, even though overall system linearity might be degraded when compared to using a Class A and Class AB driver stage. The existing design as shown in FIG. 1 does not achieve the desired efficiency. Therefore, it is still desirable to achieve better overall system efficiency by improving the driver stage efficiency without suffering a significant loss in system linearity. The present invention, as discussed further herein below, achieves these desirable characteristics and other goals as noted herein.

DETAILED DESCRIPTION OF THE EMBODIMENTS OF THE INVENTION

The present invention addresses the drawbacks of the prior art by utilizing a Doherty amplifier with a main amplifier circuit and an auxiliary amplifier circuit, both including multiple amplification stages in combination with efficiency enhancing aspects. Each of the amplifier circuits of the inventive amplifier includes a driving stage. In accordance with one aspect of the present invention, the driving stage of the auxiliary amplifier circuit has a power rating that is higher than the power rating of the main amplifier circuit to provide a gain asymmetry in the amplifier circuit paths. In accordance with another aspect of the present invention, a coupler is utilized to provide an asymmetric split of the input signal to the various paths through the auxiliary amplifier circuit and the main amplifier circuit. In accordance with still another aspect of the present invention, the auxiliary amplifier circuit has a turn-on characteristic that is determined by a combination of bias conditions for the multiple stages of the auxiliary amplifier circuit. As such, the present invention provides a method of improving overall amplifier efficiency, by improving driver efficiency without significant degradation to system linearity.

Figure 1:
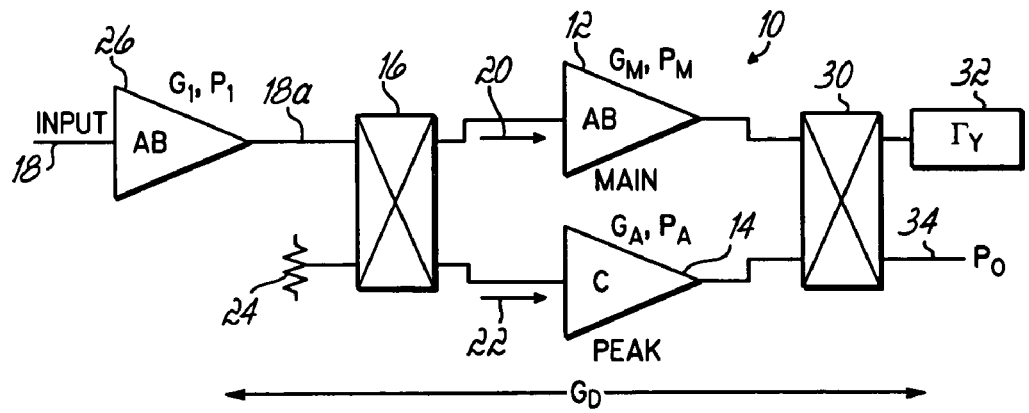
FIG. 1 illustrates a block diagram of an amplifier using a Doherty-type amplification stage.

FIG. 1 illustrates a Doherty amplifier design driven by a Class AB amplifier, as discussed above. The Doherty amplifier 10 includes a main or carrier amplifier circuit 12 and an auxiliary amplifier circuit, or peak amplifier circuit 14. Herein, the terms "auxiliary" and "peak" will be used interchangeably to indicate the auxiliary amplifier circuit, because the auxiliary amplifier circuit is often made operable based upon the level of the input signal, such as at signal peaks. Similarly, the main amplifier circuit 12 might also be referred to as a carrier amplifier circuit. A splitter circuit 16, such as an input coupler, is configured and operable to split an input signal 18 between a path 20 through the main amplifier circuit 12 and a path 22 through the peak amplifier circuit 14. The input signal 18 is input into one terminal of the coupler 16, and the other input terminal is appropriately terminated, such as with a 50 ohm load 24. The amplifier 10 includes a driver or driving amplifier stage 26, which amplifies the input signal 18 to provide an amplified signal 18a to the Doherty amplifier circuit. The outputs of the main amplifier circuit 12 and peak amplifier circuit 14 are appropriately combined, such as with a coupler circuit 30. The output of the amplifier is provided at terminal 34, while the other terminal of the coupler circuit 30 is terminated with a suitable load 32. Designs of appropriate signal coupling stages and coupler load 32 are illustrated in U.S. Pat. No. 6,922,102 and U.S. patent application Ser. No. 10/795,055, as noted above.

Figure 2:
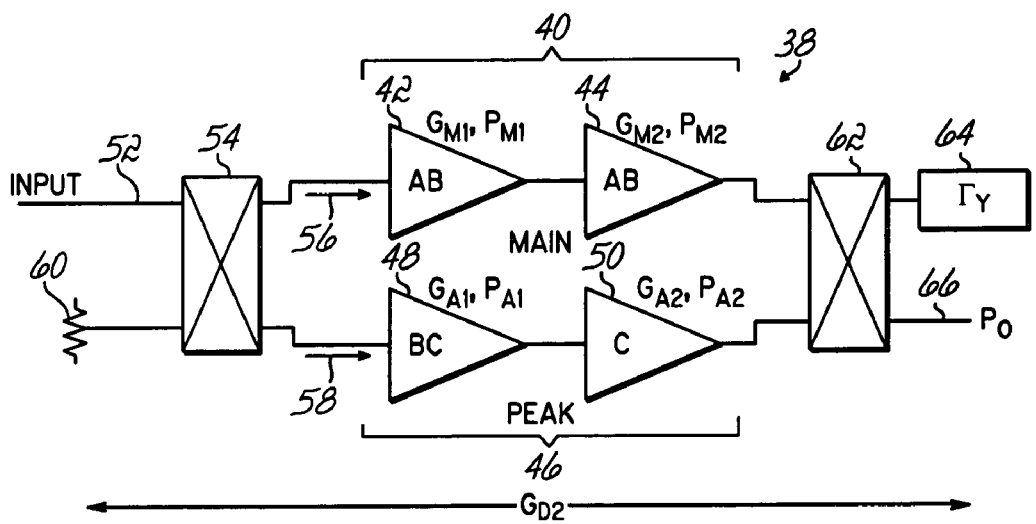
FIG. 2 is a block diagram of one embodiment of the invention.

FIG. 2 illustrates one embodiment of the present invention, which utilizes a multi-stage Doherty amplifier design, including a main amplifier circuit 40 including a driving stage 42 and a main or peak amplifier additional stage 44. The amplifier circuit 38 also includes an auxiliary or peak amplifier circuit 46 that includes multiple stages. In the embodiment of FIG. 2, a driving stage 48 precedes an additional stage, such as a peak amplifier stage 50. An input signal 52 is split by an appropriate splitter circuit, such as an input coupler 54. The input signal is thus split between a main amplifier circuit path 56 and a peak or auxiliary amplifier circuit path 58. The remaining terminal of coupler 54 may be terminated with an appropriate termination, such as a 50-ohm termination 60. The outputs of the main amplifier circuit 40 and auxiliary amplifier circuit 46 are combined at coupler 62 where the output terminal 66 provides $P_O$ and the other terminal 64 is terminated as discussed above for FIG. 1.

In accordance with one aspect of the present invention, utilizing a multi-stage amplifier circuit for both the main amplifier circuit and auxiliary amplifier circuit provides an immediate system efficiency improvement. For example, referring to FIG. 1, the output power rating $P_o$ for the overall amplifier circuit 10 may be assumed to be the same for both FIGS. 1 and 2. In FIG. 1, $P_1$ is the output power rating of the driving stage, such as the power rating for the class AB amplifier 26. $P_{M1}$ and $P_{A1}$ are the output power ratings of the first stage, or driving stage, of the main and auxiliary amplifier circuits 40, 46, respectively in FIG. 2. $G_{M1}$ and $G_{M2}$ represent the gains of the first and second stages of the main amplifier circuit 40. $G_{A1}$ and $G_{A2}$ are the respective gains of the various auxiliary amplifier circuit stages. For example, $G_{M1}$ and $G_{A1}$ refer to the gains of the driving stages of the respective main amplifier circuit 40 and the auxiliary amplifier circuit 46. The gain of the overall Doherty amplifier circuit 10 in FIG. 1 is designated $G_D$. $G_{D2}$ represents the overall gain of the Doherty amplifier circuit 38 in FIG. 2.

Due to non-ideal operation in the RF transistor output impedance and also typical peaking amplifier drive-up characteristics, Doherty amplifiers typically have less power gain than is achieved in a balanced AB amplifier made with the same pair of transistors. The amount of power degradation is typically in the range of 1-2 dB. This decreasing gain effectively appears at the input split of the Doherty amplifier and must be accounted for when determining the driving stage power rating $P_1$ (see FIG. 1). For example, with $G_M=G_A=13$ dB in FIG. 1, the overall $G_D$ would typically be 11-12 dB. The driving stage power rating $P_1$ would then be set forth by Equation 1:

$$P_1(dBm)=P_O(dBm)-G_D(dB)+M(dB) \quad (EQ\ 1)$$

M (dB) is the additional back-off margin required for the driving stage amplifier 26. This may be assumed to be 3 dB, but will vary with design specifics. As an example, with the output power rating $P_O$=56 dBm, $G_D$=11.25 dB, then $P_1$=47.75 dBm.

Turning now to FIG. 2, and assuming no output losses, the driving stage power rating $P_{M1}$ for the driving stage 42 of the main amplifier circuit 40 is set forth by Equation 2, as follows:

$$P_{M1}(dBm)=P_O(dBm)+C_O(dB)-G_{M2}(dB)+M(dB) \quad (EQ\ 2)$$

$C_O$(dB) is the output coupler ratio in dB. Generally, for equal main auxiliary amplifier ratings, that value will be −3.0 dB. With the power output rating $P_O$=56 dBm, $C_O$=−3.0 dB, $G_{M2}$=13 dB, and M=3 db, then the output power rating $P_{M1}$ for the driving stage 42 of main amplifier circuit 40 becomes 43 dBm.

Therefore, utilizing a multi-stage Doherty amplifier, as illustrated in FIG. 2, the first stage, or driving stage, of the main amplifier circuit 40 in FIG. 2 can be 4.7 dB smaller than, or ⅓ the size of the driving stage 26 in FIG. 1. As such, a system efficiency improvement is recognized because a portion of the driving stage in FIG. 2 that is operating in Class AB mode is ⅓ as large as the Class AB driving stage 26 in FIG. 1.

For the embodiment of the Doherty amplifier 10, illustrated in FIG. 1, in order to achieve an efficiency characteristic that approaches that of an ideal Doherty amplifier, the auxiliary amplifier 14 should have an RF output current that increases at a significantly greater rate with input drive voltage than the same characteristic for the main amplifier 12. This factor of a 2× greater slope may be achieved in a variety of ways.

In one way, the auxiliary, or peaking, amplifier might use an amplifier device with 2× the periphery or size of the main amplifier device 12. Ideally, this would result in a peaking amplifier 14 with 6 dB more gain than that achieved for the main amplifier 12. However, such a solution generally has some practical technical difficulties in implementing and is also often impractical from a cost perspective.

An alternative method is to provide 2× the drive voltage to the peaking, or auxiliary, amplifier circuit 14 in FIG. 1 than is provided to the main amplifier circuit 12. This might be accomplished by placing an asymmetric coupler at the Doherty input with the high loss arm of the coupler connected to the main amplifier input and the lower loss arm coupled to the auxiliary amplifier input. For the case where both the main and auxiliary amplifier output power ratings are equal, the coupler would have a value of around 7 dB. Such a power loss after the driver amplifier 26 significantly reduces the overall gain of the Doherty amplifier 10 shown in FIG. 1. This gain reduction thus requires an even higher power rating for the driver stage 26 and suffers subsequent driver stage inefficiencies that negate the improvement in the Doherty stage efficiency. The present invention addresses such drawbacks of the circuit in FIG. 1 in addition to providing the system efficiency noted above because the driving stage 42 of the main amplifier circuit 40 can be ⅓ the size of the driving stage amplifier 26 of FIG. 1.

Figure 3:
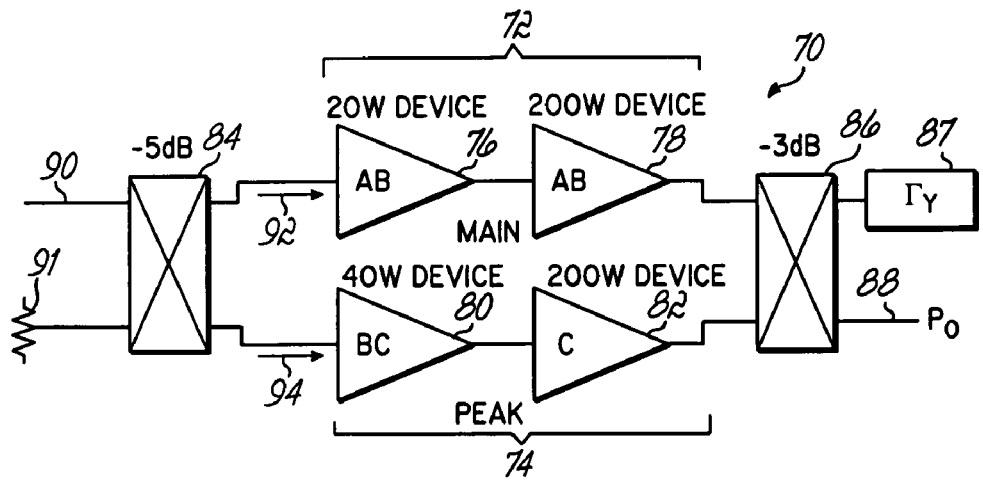
FIG. 3 is a block diagram of another embodiment of the invention.

One embodiment of the present invention that addresses such drawbacks and realizes the efficiency improvement desired is shown in FIG. 3. More specifically, the embodiment illustrated in FIG. 3 utilizes a multi-stage Doherty amplifier design 70 including a main amplifier circuit with multiple amplification stages, including a driving stage and an auxiliary amplifier circuit with multiple amplification stages, also including a driving stage. Periphery scaling is utilized between the driving stages of the main amplifier circuit and the auxiliary amplifier circuit. Furthermore, asymmetric input splitting is utilized in the input signals to the driving stages. In the inventive embodiment shown in FIG. 3, the auxiliary or peaking amplifier device periphery scaling is performed in the driving stage where it is more technically practical and cost-effective to do so. Additional gain asymmetry that is required between the main and auxiliary amplifier circuits is then provided by the choice of an input coupler value providing asymmetric splitting of the input signal. In accordance with one aspect of the present invention, when multi-stage main and auxiliary amplifier circuit are utilized, the asymmetric split of the input signal occurs at a much lower power level. Therefore, the asymmetric split has less of a negative impact on system efficiency, as opposed to the example set forth above in FIG. 1, wherein the input splitting occurs after a driving amplifier. This allows the improvement and efficiency provided by the Doherty amplifier that results from a more ideal auxiliary amplifier drive-up characteristic to be more fully realized.

Turning now to the exemplary embodiment of the invention set forth in FIG. 3, a Doherty type amplifier 70 includes multiple stages for both the main amplifier circuit 72 and the auxiliary or peak amplifier circuit 74. Specifically, the main amplifier circuit 72 includes a driving amplification stage 76 and an additional amplification stage 78. Similarly, auxiliary amplifier circuit 74 includes a driving stage 80, as well as an additional stage 82. While two stages are shown for each of the main and auxiliary amplifier circuits, additional stages might also be utilized.

In accordance with one aspect of the present invention, the multi-stage Doherty design of amplifier 70 incorporates periphery scaling between the driving stages. Specifically, the peak amplifier driving stage 80 is 2× the periphery or size of the main amplifier driving stage 76. For example, as shown in FIG. 3, if driving stage 76 incorporates a 20-Watt device, driving stage 80 incorporates a 40-Watt device in order to satisfy a 20-Watt power-rating requirement. The 40-Watt driving stage 80 is intentionally matched to provide more gain at the expense of output power capability for that stage. Due to transistor imperfections, the additional gain that is actually obtained by the periphery scaling of the auxiliary amplifier driving stage 80 only provides a portion of the desired gain asymmetry. While the additional amplification stages 78, 82 for both the main and auxiliary circuits are shown the same power (i.e., 200 Watts), it is not critical to the invention that those stages are equal.

In accordance with another aspect of the present invention, a coupler is utilized to provide additional gain asymmetry that is desired to achieve a more ideal Doherty performance. As noted above, the present invention provides the input signal split prior to the driving stages and, thus, at a much lower power level. This improves the overall system efficiency. In the embodiment illustrated in FIG. 3, a −5 dB input coupler 84 is utilized to provide additional gain asymmetry between the main path 92 and the auxiliary path 94. The auxiliary path 94 receives the greater portion of the input signal from the asymmetric split provided by coupler 84. The main amplifier circuit 72 and peak amplifier circuit 74 are terminated with a suitable termination, such as a −3 dB coupler 86 and a suitable termination 87. As noted above, various suitable terminations are recited in the patents and application that are incorporated herein and commonly assigned with the present application. The output power $P_O$ (88) is the result of the combined signals from the main and peak amplifier circuits 72, 74. An input signal 90 is asymmetrically split by coupler 84. The input signal is split between a main amplifier circuit path 92 and the auxiliary amplifier circuit path 94, and directed to the main and peak amplifier circuits where additional gain asymmetry is employed in the multi-stage Doherty amplifier 70 of the invention. An additional input terminal to coupler 84 is terminated with a suitable termination 91, such as a 50-ohm termination.

In accordance with another aspect of the present invention, an additional characteristic of the auxiliary or peak amplifier circuit 74 is the turn-on point, or input voltage point where the peak amplifier circuit RF output current becomes non-zero. As understood by a person of ordinary skill in the art, the Doherty amplifier operates by generally amplifying the input signal with the main amplifier until the input voltage level rises to the point where the peak amplifier is necessary. Thereafter, the output is a combination of amplified signals from both the main amplifier circuit 72 and peak amplifier circuit 74. The turn-on point is generally controlled with a choice of the bias voltage of the peaking amplifier. In one example, the bias voltage may be the gate bias voltage in the case of a field effect transistor or FET.

Generally, in the amplifier circuit 10, illustrated in FIG. 1, the turn-on point is determined by a single control, which is the gate bias of the single-stage peak amplifier 14. However, in accordance with the aspects of the present invention, in the multi-stage amplifier design illustrated in FIG. 3, the turn-on point for the peak amplifier circuit 74 is determined by the combination of bias voltages, such as gate bias voltages, chosen for the multiple, individual peaking amplifier stages. Generally, in an ideal situation, the turn-on point would be a sharp increase from zero in the peak amplifier RF output current. However, generally, actual transistors will have a more gradual turn-on characteristic. In accordance with one aspect of the present invention, cascading one or more turn-on characteristics based upon the cascaded multiple stages 80, 82 of the peak amplifier circuit 74, the present invention provides an increased freedom to tailor the shape of the turn-on characteristic of the peak amplifier circuit 74. This is useful when optimizing the linearity of the overall Doherty amplifier.

In the example of the invention illustrated in FIG. 3, the peak amplifier bias points may be selected experimentally to trade off efficiency with linearity. In the example set forth in FIG. 3, the driving stage 80 of the peak amplifier circuit 74 is not biased as a class AB device similar to the driving stage 76 of the main amplifier circuit 72. Rather, the driving stage 80 is biased close to Class B, or possibly slightly into the A/B or B/C regions. In the embodiment shown in FIG. 3, the driving stage 80 is shown to be classified in the B/C region. Then, the additional stage 82 of the peak amplifier circuit 74 is biased further into a Class C region than the preceding driving stage 80. Therefore, it is desirable to bias the multiple stages in the peak amplifier circuit 74 to achieve greater efficiency. It is particularly desirable to bias the stages 82 following the driving stage 80 to an operation point that yields greater efficiency.

Accordingly, the present invention utilizes a combination of amplifier device periphery scaling and asymmetric input splitting in combination with multi-stage main and peak amplifier circuits to more effectively improve overall efficiency. Furthermore, the invention provides multiple turn-on characteristics for the peak amplifier circuit 74 to yield a more desirable turn-on characteristic to optimize the linearity of the overall Doherty amplifier 70.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:
1. An amplifier comprising:
a main amplifier circuit with multiple amplification stages, including a driving stage;
an auxiliary amplifier circuit with multiple amplification stages, including a driving stage, the auxiliary amplifier circuit being selectively operable to operate in combination with the main amplifier circuit;
a splitter circuit operable to split an input signal to the amplifier between paths through the main amplifier circuit and the auxiliary amplifier circuit;

the driving stage of the auxiliary amplifier circuit having a power rating higher than the power rating of the driving stage of the main amplifier circuit to provide a gain asymmetry in the amplifier circuit paths; and the auxiliary amplifier circuit having a turn-on characteristic that is dependent upon bias and that is determined by a combination of bias conditions for the multiple stages of the auxiliary amplifier circuit.

2. The amplifier of claim 1 wherein the splitter circuit is an input coupler that is operable to provide path asymmetry in splitting the input signal between the main amplifier path and auxiliary amplifier path.

3. The amplifier of claim 2 wherein the input coupler is a −5 dB coupler configured to provide a greater input signal portion in the auxiliary amplifier path.

4. The amplifier of claim 1 wherein the driving stage of the auxiliary amplifier circuit has a bias condition to place the driving stage in one of a Class B, Class AB or Class BC region.

5. The amplifier of claim 1 wherein the additional stage of the auxiliary amplifier circuit has a bias condition to place the additional stage in approximately a Class C region.

6. The amplifier of claim 1 further comprising a coupler circuit coupled to combine the outputs of the main amplifier circuit and the auxiliary amplifier circuit.

7. An amplifier comprising:
a main amplifier circuit with multiple amplification stages, including a driving stage;
an auxiliary amplifier circuit with multiple amplification stages, including a driving stage, the auxiliary amplifier circuit being selectively operable to operate in combination with the main amplifier circuit;
a splitter circuit operable to split an input signal to the amplifier between paths through the main amplifier circuit and the auxiliary amplifier circuit and operable to provide path asymmetry in splitting the input signal between the paths;
the auxiliary amplifier circuit having a turn-on characteristic that is dependent upon bias and that is determined by a combination of bias conditions for the multiple stages of the auxiliary amplifier circuit.

8. The amplifier of claim 7 wherein the splitter circuit includes an input coupler for coupling portions of the input signal onto the paths.

9. The amplifier of claim 8 wherein the input coupler is a −5 dB coupler configured to provide a greater input signal portion in the auxiliary amplifier path.

10. The amplifier of claim 7 wherein the driving stage of the auxiliary amplifier circuit has a bias condition to place the driving stage in one of a Class B, Class A/B or Class B/C region.

11. The amplifier of claim 7 wherein the additional stage of the auxiliary amplifier circuit has a bias condition to place the additional stage in approximately a Class C region.

12. An amplifier comprising:
a main amplifier circuit;
an auxiliary amplifier circuit, the auxiliary amplifier circuit being selectively operable, based on a turn-on characteristic, to operate in combination with the main amplifier circuit;
the auxiliary circuit having multiple amplification stages and having a turn-on characteristic dependent upon bias, the turn-on characteristic being determined by a combination of bias conditions for the multiple amplification stages of the auxiliary amplifier circuit.

13. The amplifier of claim 12 wherein the main amplifier circuit and auxiliary amplifier circuit each include multiple amplification stages.

14. A method of amplifying a signal comprising:
splitting an input signal between a main amplifier circuit with multiple amplification stages, including a driving stage and an auxiliary amplifier circuit with multiple stages, including a driving stage, the auxiliary amplifier circuit having a turn-on characteristic dependent upon bias;
selectively operating the auxiliary amplifier circuit to operate in combination with the main amplifier circuit;
the driving stage of the auxiliary amplifier circuit having a power rating higher than the power rating of the main amplifier circuit to provide a gain asymmetry in the amplifier circuit paths;
establishing the turn-on characteristic of the auxiliary amplifier circuit by a combination of bias conditions for the multiple stages of the auxiliary amplifier circuit.

15. The method of claim 14 further comprising splitting the input signal to provide path asymmetry between a main amplifier path and an auxiliary amplifier path.

16. The method of claim 14 further comprising biasing the driving stage of the auxiliary amplifier circuit to place the driving stage in one of a Class B, Class A/B or Class B/C region.

17. The method of claim 14 further comprising biasing an additional stage of the auxiliary amplifier circuit to place the additional stage in approximately a Class C region.

18. A method of amplifying a signal comprising:
inputting an input signal between a main amplifier circuit with multiple amplification stages, including a driving stage and an auxiliary amplifier circuit with multiple stages, including a driving stage, the auxiliary amplifier circuit having a turn-on characteristic dependent upon bias;
selectively operating the auxiliary amplifier circuit to operate in combination with the main amplifier circuit;
splitting the input signal asymmetrically between paths through the main amplifier circuit and the auxiliary amplifier circuit; and
establishing the turn-on characteristic of the auxiliary amplifier circuit by a combination of bias conditions for the multiple stages of the auxiliary amplifier circuit.

19. The method of claim 18 further comprising splitting the input signal to provide a greater input signal portion in the auxiliary amplifier path.

* * * * *